(12) United States Patent
Nabhane et al.

(10) Patent No.: US 9,424,127 B2
(45) Date of Patent: Aug. 23, 2016

(54) CHARGER DETECTION AND OPTIMIZATION PRIOR TO HOST CONTROL

(71) Applicant: Broadcom Corporation, Irvine, CA (US)

(72) Inventors: Walid Nabhane, Long Valley, NJ (US); Mark D Rutherford, Wellington, CO (US); Narayan Prasad Ramachandran, Bangalore (IN); David Chang, Irvine, CA (US); Yi Ting Chen, New Taipei (TW); Chenmin Zhang, Irvine, CA (US); Ajmal A. Godil, San Diego, CA (US)

(73) Assignee: BROADCOM CORPORATION, Irvine, CA (US)

( * ) Notice: Subject to any disclaimer, the term of this patent is extended or adjusted under 35 U.S.C. 154(b) by 351 days.

(21) Appl. No.: 13/950,762

(22) Filed: Jul. 25, 2013

(65) Prior Publication Data

US 2014/0223200 A1 Aug. 7, 2014

Related U.S. Application Data

(60) Provisional application No. 61/759,470, filed on Feb. 1, 2013, provisional application No. 61/833,598, filed on Jun. 11, 2013, provisional application No. 61/834,513, filed on Jun. 13, 2013, provisional (Continued)

(51) Int. Cl.
*G06F 1/26* (2006.01)
*G06F 11/10* (2006.01)

(Continued)

(52) U.S. Cl.
CPC ............ *G06F 11/1048* (2013.01); *G01R 31/36* (2013.01); *G05F 1/625* (2013.01); *G06F 1/26* (2013.01); *G06F 1/3206* (2013.01); *G06F 1/3287* (2013.01); *G06F 11/1016* (2013.01); *G06F 11/3062* (2013.01); *G06F 11/3093* (2013.01); *G06F 13/126* (2013.01);

(Continued)

(58) Field of Classification Search
CPC .... G01R 19/003; G01R 31/36; G01R 31/40; G05F 1/625; G06F 11/1016; G06F 11/1048; G06F 11/3031; G06F 11/3058; G06F 11/3062; G06F 11/3093; G06F 13/126; G06F 1/26; G06F 1/3206; G06F 1/3287; G11C 7/106; G11C 7/1072
See application file for complete search history.

(56) References Cited

U.S. PATENT DOCUMENTS 5,218,607 A * 6/1993 Saito et al. .................. 714/22
6,301,133 B1 * 10/2001 Cuadra ................. H02J 1/102
363/65

(Continued)

*Primary Examiner* — Thomas Lee
*Assistant Examiner* — Chad Erdman
(74) *Attorney, Agent, or Firm* — Oblon, McClelland, Maier & Neustadt, L.L.P.

(57) ABSTRACT

Aspects of charger detection and optimization prior to host control are described herein. In various embodiments, a condition of whether reverse current is present on a system bus is detected. When the condition for reverse current is present, reverse current is sunk by one or more of various reverse current sink circuits. By relying upon one or more of the reverse current sink circuits, for safety, to address or mitigate the condition for reverse current, a detector may be able to identify or distinguish among several different types of charger or charging ports coupled to a system bus allowing a charger to be selected optimally. Further, an indicator of the type of charger or charging port coupled to the system bus is communicated over a single pin interface, for backwards compatibility with circuits capable of identifying between only two different types of chargers.

20 Claims, 5 Drawing Sheets

Related U.S. Application Data application No. 61/836,327, filed on Jun. 18, 2013, provisional application No. 61/836,306, filed on Jun. 18, 2013, provisional application No. 61/836,895, filed on Jun. 19, 2013, provisional application No. 61/836,886, filed on Jun. 19, 2013, provisional application No. 61/836,903, filed on Jun. 19, 2013.

(51) Int. Cl.

| | |
|---|---|
| *G05F 1/625* | (2006.01) |
| *G06F 13/12* | (2006.01) |
| *G01R 31/36* | (2006.01) |
| *H02J 7/00* | (2006.01) |
| *G06F 1/32* | (2006.01) |
| *G11C 7/10* | (2006.01) |
| *G06F 11/30* | (2006.01) |
| *G01R 31/40* | (2014.01) |
| *G01R 19/00* | (2006.01) |

(52) U.S. Cl.
CPC .............. *G11C 7/106* (2013.01); *G11C 7/1072* (2013.01); *H02J 7/0029* (2013.01); *G01R 19/003* (2013.01); *G01R 31/40* (2013.01); *G06F 11/3031* (2013.01); *G06F 11/3058* (2013.01); *Y02B 60/1282* (2013.01)

(56) References Cited

U.S. PATENT DOCUMENTS

| | | | |
|---|---|---|---|
| 8,278,997 B1* | 10/2012 | Kim et al. | 327/541 |
| 2011/0171506 A1* | 7/2011 | Nozawa et al. | 429/91 |
| 2013/0082644 A1* | 4/2013 | Gagne et al. | 320/107 |
| 2013/0231894 A1* | 9/2013 | Paakkonen et al. | 702/183 |
| 2014/0002006 A1* | 1/2014 | Zhang | 320/107 |

* cited by examiner

CHARGER DETECTION AND OPTIMIZATION PRIOR TO HOST CONTROL

CROSS-REFERENCE TO RELATED APPLICATIONS

This application claims the benefit of:

U.S. Provisional Application No. 61/759,470, filed Feb. 1, 2013;

U.S. Provisional Application No. 61/833,598, filed Jun. 11, 2013;

U.S. Provisional Application No. 61/834,513, filed Jun. 13, 2013;

U.S. Provisional Application No. 61/836,327, filed Jun. 18, 2013;

U.S. Provisional Application No. 61/836,306, filed Jun. 18, 2013;

U.S. Provisional Application No. 61/836,895, filed Jun. 19, 2013;

U.S. Provisional Application No. 61/836,886, filed Jun. 19, 2013; and

U.S. Provisional Application No. 61/836,903, filed Jun. 19, 2013, the entire contents of each of which are hereby incorporated herein by reference.

This application also makes reference to:

U.S. patent application Ser. No. 13/950,716, titled "Clock Domain Crossing Serial Interface, Direct Latching, and Response Codes" and filed on even date herewith;

U.S. patent application Ser. No. 13/950,725, titled "Power and System Management Information Visibility" and filed on even date herewith;

U.S. patent application Ser. No. 13/950,738, titled "Power Mode Register Reduction and Power Rail Bring Up Enhancement" and filed on even date herewith;

U.S. patent application Ser. No. 13/950,750, titled "Dynamic Power Profiling" and filed on even date herewith;

U.S. patent application Ser. No. 13/950,769, titled "Enhanced Recovery Mechanism" and filed on even date herewith; and U.S. patent application Ser. No. 13/950,776, titled "Dynamic Power Mode Switching Per Rail" and filed on even date herewith, the entire contents of each of which are hereby incorporated herein by reference.

BACKGROUND

Battery-powered computing systems and devices have been adopted for use in many aspects of daily life. As these systems and devices are more widely adopted and used in place of other computing systems and devices, they are designed to be more flexible and powerful, but are also more complex. With advances in the design of battery-powered computing devices, the availability of sufficient power for the devices continues to be an ongoing concern. For example, each new feature in a battery-powered computing device may require the provision of circuitry that supports a supply of power for the feature.

In the context of system power management, some battery-powered computing systems include power management processing circuitry that manages the supply of power. Over time, this power management processing circuitry may need to evolve to better adapt to battery-related concerns, such as flexibility and control in battery charging, especially in cases of very low battery charge.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
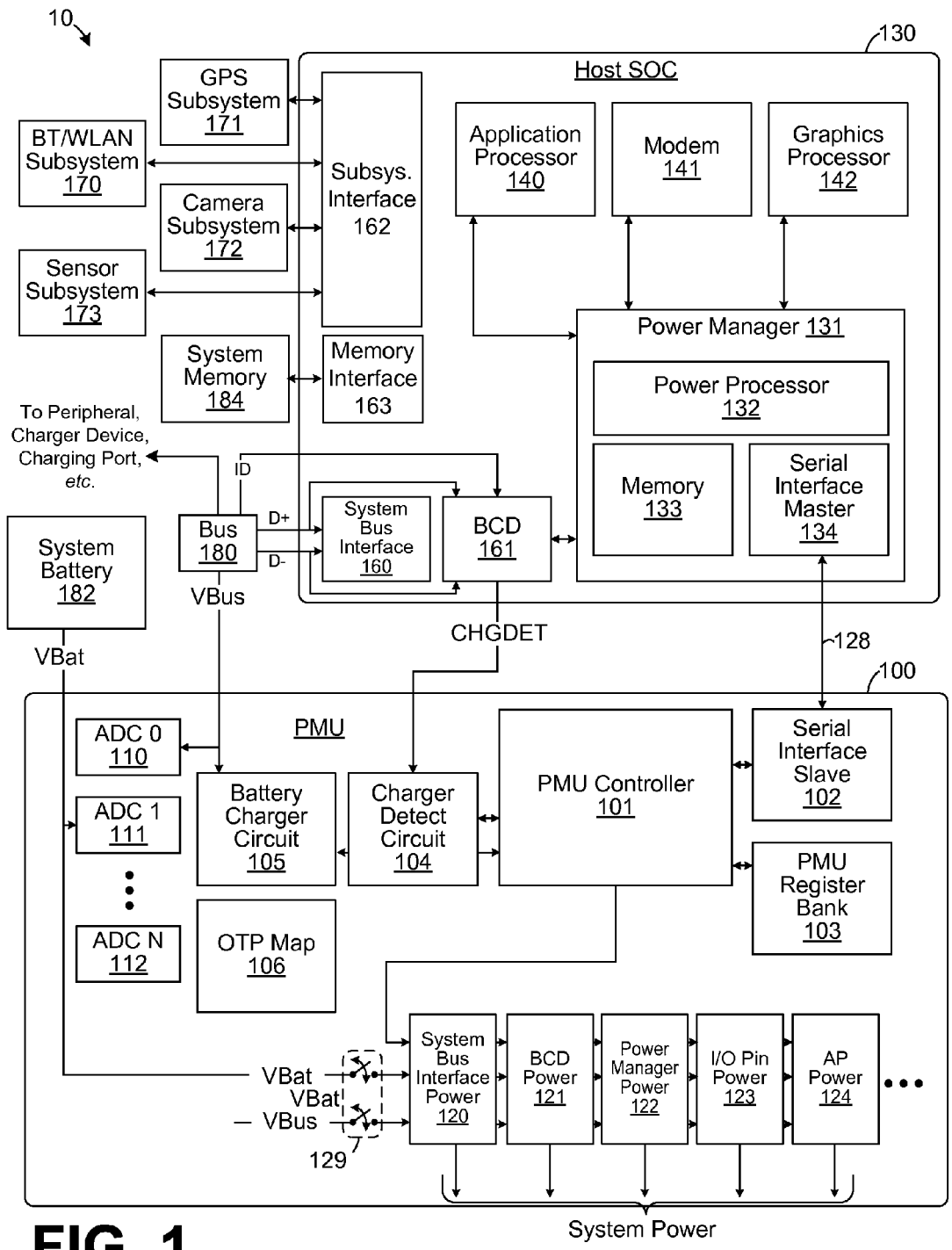
FIG. 1 illustrates a system for charger detection and optimization prior to host control according to an example embodiment.

In the context of system power management, some battery-powered computing systems include power management processing circuitry that manages the supply of power. Over time, this power management processing circuitry may need to evolve to better adapt to battery-related concerns, such as flexibility and control in battery charging, especially in cases of very low battery charge Additionally, the need for power management processing circuitry to balance problems related to battery charging and discharging in the context of a user's experience is now more important. Engineers now consider a full array of problems associated with battery charging and discharging in the context of user experience. For example, even when a battery is substantially discharged, a user desires battery-powered computing systems and devices to power up promptly when coupled to power for charging, regardless of the fact that a minimum threshold of charge and/or voltage may be necessary in the battery for powering up. Similarly, engineers must consider certain aims of manufacturing and testing that achieve high volume production of battery-powered computing systems and devices.

At the same time, the number of different types of battery chargers and charging ports that may be coupled to battery-powered computing systems continues to grow. Among other variations, certain battery chargers and charging ports are capable of supplying more or less current for charging via a system bus. These battery chargers and charging ports may be identified by various means including by the characterization of impedances and/or voltages coupled to one or more pins of the system bus to which the battery charger or charging port is coupled. However, it is noted that, in certain cases, some battery chargers or charging ports may damage battery-powered computing systems, if not properly identified. In other cases, some charging ports may be damaged by battery-powered computing systems when attempting to identify a type of the charging port.

To identify a type of charger or charging port coupled to a system bus in certain conventional systems, it was necessary to boot a host application processor, read instructions from system memory, load drivers for communicating over the system bus, communicate with a battery charger or charging port coupled to the system bus, identify a type of battery charger or charging port coupled to the system bus based on the communication, and make operating decisions according to the identification. However, in cases of extreme battery discharge, the host application processor in a battery-powered computing device may not be able to boot for a significant period of time. During this time, a power management unit may operate to charge a system battery to the minimum charge required to boot the host application processor. In this context, the power management unit may perform the tasks of charging the system battery (without knowledge of the type of charger or charging port coupled to the system bus) and monitoring the charge stored in the system battery to determine when the application processor may be released to start or boot.

Without the ability to identify the type of battery charger or charging port coupled to the system bus (and how much current is available for charging), however, the power management unit was generally relegated to charging the system battery using a nominal or low current setting. In some systems, one of two types of battery chargers or charging ports could be identified, for example, before the host application processor was started. Even in this case, charging was relegated to one of two nominal or low current settings. Thus, battery charging without charger identification and/or control by the host application processor required a relatively long time.

In this context, aspects of charger detection and optimization prior to host control are described herein. In various embodiments, a condition of whether reverse current is present on a system bus is detected. When the condition for reverse current is present, reverse current is sunk by one or more reverse current sink circuits. By relying upon one or more of the reverse current sink circuits to address or mitigate the condition for reverse current, a detector may be able to identify or distinguish among several different types of charger or charging ports coupled to a system bus to charge a system battery as fast as possible. Further, an indicator of the type of charger or charging port coupled to the system bus is communicated over a single pin interface, for backwards compatibility with circuits capable of identifying between only two different types of chargers.

Turning now to the drawings, an introduction and general description of exemplary embodiments of a system is provided, followed by a description of the operation of the same.

I. System Introduction

FIG. 1 illustrates a system 10 for charger detection and optimization prior to host control according to an example embodiment. The system 10 may embody a computing device that includes a number of general and/or specific purpose circuits, processing circuits, processors, registers, memories, sensors, displays, etc. In one embodiment, the system 10 may embody a handheld or portable computing device which is powered from charge stored in a battery. In various embodiments, the system 10 may be embodied as part of a cellular telephone, tablet computing device, laptop computer, or other computing device. Alternatively, because the embodiments described herein are not limited to use in handheld or portable computing devices, the system 10 may be embodied as part of a desktop or set top computing device, for example. Although not illustrated in FIG. 1, it should be appreciated that the system 10 may include one or more displays, microphones, speakers, buttons, indicator lights, haptic feedback elements, memory card readers, etc.

Among other elements, the system 10 includes a power management unit (PMU) 100, a host system-on-chip (SOC) 130, a system bus 180, a system battery 182, and a system memory 184. The system 10 also includes certain subsystems such as a bluetooth/wireless local area network (WLAN) subsystem 170, a global positioning system (GPS) subsystem 171, a camera subsystem 172, and a sensor subsystem 173. The subsystems 170-173 are representative subsystems which may be included as elements of the system 10, and other subsystems are within the scope and spirit of the embodiments described herein. It is noted that, just as the host SOC 130 requires power for operation, each of the subsystems 170-173, the system memory 184, and other elements and circuits of the system 10 depend on power for operation. As described below, this power may be supplied by and under the control of the PMU 100.

The system bus 180 of the system 10 is electrically and communicatively coupled among the PMU 100 and the host SOC 130. As described herein, the system bus 180 may be relied upon by the system 10 for both data communications to external computing systems and peripherals, and to electrically couple a supply of power to the system 10 for charging the system battery 182. In this context, the system bus 180 may be coupled to one of various types of battery chargers or charging ports capable of supplying current to the system 10.

The system bus 180 may include any communications bus suitable for the application, such as the universal serial bus (USB), although the use of other serial and/or parallel bus topologies are within the scope and spirit of the embodiments described herein. For a USB bus, the system bus 180 includes V+ and V− (e.g., ground) power conductors that supply a voltage of about 5V (e.g., 4.75-5.25V) and D+ and D− differential data conductors that communicate differential logic values at a nominal voltage difference of about 2.5V, although it should be appreciated that other communications buses may rely upon variations of these example power and differential data conductors. Depending upon the type of plug used, the system bus 180 may also be coupled to an ID pin, which is used for accessory charger adapter port (ACA) or proprietary accessory device detection. Depending upon the source coupled to the system bus 180, a current between 100 mA and 1.5 A or more may be supplied to the system 10 via the system bus 180.

The system battery 182 may be embodied as any rechargeable battery suitable for the application, such as a lithium-ion, nickel-metal-hydride, or other battery variant, without limitation. The system memory 184 may be embodied as a volatile and/or non-volatile random access memory or combination thereof. The system memory 184 may store computer-readable instructions thereon that, when executed by one or more of the processors 140-142 of the host SOC 130, for example, direct the processors 140-142 to execute various aspects of the embodiments described herein.

In general, the PMU 100 controls and/or facilitates control of the distribution of power from the system battery 182 to the elements of the system 10, such as the host SOC 130, the subsystems 170-173, and the system memory 184, for example. As further described below, depending upon the operating state of the system 10 and/or other factors, the PMU 100 may control the distribution of power to one or more elements of the system 10, or the PMU 100 may receive instructions to control the distribution of power to one or more elements of the system 10.

Among other elements, the PMU 100 includes a PMU controller 101, a serial interface slave 102, a PMU register bank 103, a charger detect circuit 104, a battery charger circuit 105, a one time programmable (OTP) map 106, a number 0-N of analog-to-digital (ADC) circuits 110-112, and a number of power rail circuits 120-124. It is noted that FIG. 1 illustrates a representative example of elements of the PMU 100, and it should be appreciated that the PMU 100 may include other elements in various embodiments. For example, the PMU 100 may include an additional power rail circuit to provide power for the system memory 184, among other additional power rails.

Among other elements, the host SOC 130 includes general and/or application specific processors. In FIG. 1, the host SOC 130 includes a power manager 131, an application processor 140, a modem 141, and a graphics processor 142. In various embodiments, the host SOC 130 may omit one or more of the processors 140-142 or include processors in addition to the processors 140-142. The host SOC 130 also includes a system bus interface 160, a battery charger detect (BCD) circuit 161, a subsystem interface 162, and memory interface 163. The subsystem interface 162, the memory interface 163, and the system bus interface 160 electrically and communicatively couple the subsystems 170-173, the system memory 184, and the system bus 180 to the host SOC 130 and, particularly, to one or more of the processors 140-142.

The application processor 140 may be embodied as a general purpose processor for executing various applications. For example, the application processor 140 may execute an underlying operating system along with applications such as e-mail, short message service (SMS), telephone, camera, web-browser, and other applications, without limitation. As compared to the PMU 100 and/or the power manager 131, the application processor 140 may consume relatively more power during operation. The modem 141 may include a cellular-based (or similar) communications processor for the communication of data wirelessly in connection with radio-frequency front end circuitry, and the graphics processor 142 may include a processor for driving a display of the system 10.

The power manager 131 includes a power processor 132, a memory 133, and a serial interface master 134. The power processor 132 may be embodied as a relatively small and low power processor or processing circuit for interfacing with the PMU 100 via a serial interface 128. In one embodiment, the serial interface master 134 of the power manager 131 controls the serial interface 128, although the PMU 100 may control the serial interface 128 in other embodiments. The memory 133 stores computer-readable instructions for execution by the power processor 132.

It is noted that, in certain embodiments, the host SOC 130 (including the power processor 132) and the PMU 100 may be combined in an integrated circuit. In this case, the serial interface 128 may be omitted and, for example, the BCD 161 and the charger detect circuit 104 may be combined.

II. System Operation

With reference to the elements of the system 10 introduced above, aspects of the operation of the system 10 are described below.

A. PMU Operation

The PMU 100 may be designed, adapted, and configured to perform operations that support the host SOC 130, the subsystems 170-173, the system memory 184, and other elements of the system 10. For example, the PMU 100 may identify system parameters for the system 10, such as the type of battery charger or charging port coupled to the system bus 180, regardless of whether the host SOC 130 and other elements of the system 10 are powered off.

It is noted that a certain amount of overhead processing is relied upon in the system 10, such as battery charging, maintenance of a real time clock, etc., and this overhead processing may be generally performed by the PMU 100 regardless of whether the host SOC 130 and other elements of the system 10 are powered off. In this context, while the system 10 remains in a powered-off mode of operation (except for the PMU 100 in most cases), the PMU 100 is designed to consume a relatively small amount of power from the system battery 182 because power may be limited and the system battery 182 may be discharging.

The PMU controller 101 generally coordinates and controls the operations of the PMU 100. The PMU controller 101 may be embodied as a general or specific purpose circuit, processing circuit, processor, state machine, etc. The PMU controller 101 interfaces with the charger detect circuit 104 and the battery charger circuit 105 to charge the system battery 182 when power for charging is available, interfaces with the serial interface slave 102 to communicate with the host SOC 130 over the serial interface 128, interfaces with the power rail circuits 120-124 to control power to the system 10, and interfaces with the PMU register bank 103 to store and access data associated with the status of the PMU 100 and the system 10. Additionally, the PMU controller 101 interfaces with other elements of the PMU 100, such as the ADCs 110-112 and the OTP map 106.

The serial interface slave 102 comprises one end of the serial interface 128 that facilitates communication between the PMU 100 and the host SOC 130. Among various modes and states of operation of the system 10, the serial interface 128 is relied upon to communicate data between the PMU 100 and the host SOC 130. For example, the PMU 100 may gather data regarding a type of battery charger or charging port coupled to the system bus 180, a battery voltage of the system battery 182 (i.e., VBat), a bus voltage on the system bus 180 (i.e., VBus), and/or whether a feature option in the system 10 is set. In part, this system status data may be gathered using one or more of the ADCs 110-112. For example, the ADCs 110-112 may convert analog values of the VBat and VBus voltages into digital values for processing and/or storage by the PMU 100.

In connection with the BCD circuit 161 of the host SOC 130, the charger detect circuit 104 may be relied upon to identify or detect the type of battery charger or charging port coupled to the system bus 180 and report the type of battery charger or charging port to the PMU controller 101. By identifying the type of battery charger or charging port coupled to the system bus 180, the charger detect circuit 104 and/or the PMU controller 101 may determine an amount of power that is available for charging via the system bus 180. For example, depending upon the type of charger or charging port coupled to the system bus 180, the charger or port may be able to source a current of between 100 mA and 1.5 A or more at a certain voltage, without collapse. In certain aspects of the embodiments described herein, the system 10 may be able to tailor its operation based on the amount of power available to charge the system battery 182.

When identifying the type of charger or charging port coupled to the system bus 180, the BCD circuit 161 and/or charger detect circuit 104 may identify or distinguish among a charging downstream port (CDP), a dedicated charging port (DCP), ACA port, a personal system 2 (PS/2) port, or a standard downstream port (SDP). Additionally, the BCD circuit 161 may identify or distinguish between one or more different types of battery chargers. Each of battery chargers and charging ports may be able to source a certain amount of power to the system 10.

When the system 10 is coupled to charging power via the system bus 180, the battery charger circuit 105 may charge the system battery 182 based on the type of battery charger or charging port coupled to the bus 180. For example, depending upon the amount of power available to charge the system battery 182, the battery charger circuit 105 may charge the system battery 182 relatively slowly or quickly. In addition to the VBat and VBus voltages, a charging status of the system battery 182 and the type of charger or charging port coupled to the system bus 180 may be stored by the PMU controller 101 in the PMU register bank 103.

In certain modes and states of operation of the system 10, the PMU 100 may rely upon a strap switch 129 to electrically couple power from the system bus 180 (i.e., VBus) to one or more of the power rails 120-124 (or other power rails), and to electrically de-couple power from the system battery 182 (i.e., VBat) from the one or more of the power rails 120-124. In this context, the strap switch 129 may couple power from the system bus 180 to one or more of the power rails 120-124 if the system battery 182 lacks sufficient voltage for the operation of certain elements in the system 10 within operating requirements. In various embodiments, it is noted that the strap switch 129 may include one or more switches, as well as protection and/or regulation circuitry that filters and/or conditions power coupled to the system 10 via the system bus 180.

As one example use of the strap switch 129, the PMU controller 101 may control the strap switch 129 to couple power from the system bus 180 to a power rail for the system memory 184, for at least a limited period of time, if the system battery 182 has not yet reached a threshold voltage (e.g., ~3.2 V) required for stable operation of the system memory 184. It is noted that, among the elements in the system 10, certain elements may require a relatively higher voltage for operation than others. Rather than waiting for the system battery 182 to charge to the relatively higher voltage necessary for these elements, the strap switch 129 may be relied upon to provide the VBus voltage, rather than the VBat voltage, to the power rails for these elements. In turn, the power rails may regulate and/or condition the VBus voltage from the system bus 180 to a voltage suitable for operation of the elements that require the relatively higher voltage. In this way, the system 10 may be started faster, because it is not necessary to wait for the system battery 182 to charge to the relatively higher voltage. Elements in the system 10 that do not require the relatively higher voltage may be powered by power rails supplied by the voltage VBat from the system battery 182. After the voltage VBat of the system battery 182 reaches a voltage sufficient to support the relatively higher voltage, the strap switch 129 may again couple power from the system battery 182 to the power rails for the elements which require the relatively higher voltage.

The OTP map 106 includes an array of programmable fuses or similar circuit elements that may each be programmed to retain a logical value. In this context, the OTP map 106 may be programmed during an initial test of the PMU 100 after manufacture, for example, or at another suitable time. The logical values retained in the OTP map 106 may be referenced by the PMU controller 101, to direct conditional operation of the PMU controller 101. For example, the logical values retained in the OTP map 106 may be relied upon to store initial voltage settings, for example, for one or more of the power rail circuits 120-124.

Further, the OTP map 106 may store battery charging currents associated with different types of battery chargers and charging ports, as further described below. For example, depending upon the type of battery charger or charging port coupled to the system bus 180, a current of between 100 mA and 1.5 A or more may be available for charging the system battery 182 and other functions of the system 10. In this context, the OTP map 106 may store certain settings for battery charging, rail voltages, power-up sequences, system limitations, etc., depending upon the type of charger or port coupled to the system bus 180. Further, the OTP map may store settings associated with other system parameters measured and/or evaluated by the PMU 100.

B. Host SOC Operation

The host SOC 130 may be generally embodied as a full system-on-chip semiconductor device. In this sense, the host SOC 130 integrates various general and/or application specific processors and processing circuits into a single integrated circuit package, reducing space. Overall, the power manager 131 of the host SOC 130 supports the host SOC 130 and the power requirements of the host SOC 130.

The power manager 131 of the host SOC 130 may retrieve and evaluate system status data stored in the PMU 100, while coordinating with the PMU 100. As described in further detail below, the power processor 132 of the power manager 131 and the PMU 100 may operate in connection with each other to power up elements in the system 10 based on system status data gathered by the PMU 100.

In the context of power up of the host SOC 130, it is noted that each of the system bus interface 160, the BCD 161, the power manager 131, the application processor 140, the modem 141, and the graphics processor 142 may be powered by a respective power rail of the PMU 100 in the system 10. For example, in the embodiment illustrated in FIG. 1, the system bus interface 160 is powered by the power rail 120, and the BCD 161 is powered by the power rail 121. Each of the power rails 120-124 may be electrically coupled from the PMU 100 to the host SOC 130 by one or more respective power traces in the system 10 and power pins or pads of the PMU 100 and the host SOC 130.

According to aspects of the embodiments described herein, the BCD 161 detects whether a condition for reverse current is present on the system bus 180. The BCD 161 also sinks the reverse current when the condition for reverse current is present. The BCD 161 further identifies among several different types of charger or charging ports coupled to the system bus 180, and communicates an indicator of the type of charger or charging port to the PMU 100 over a single pin interface.

Figure 2A:
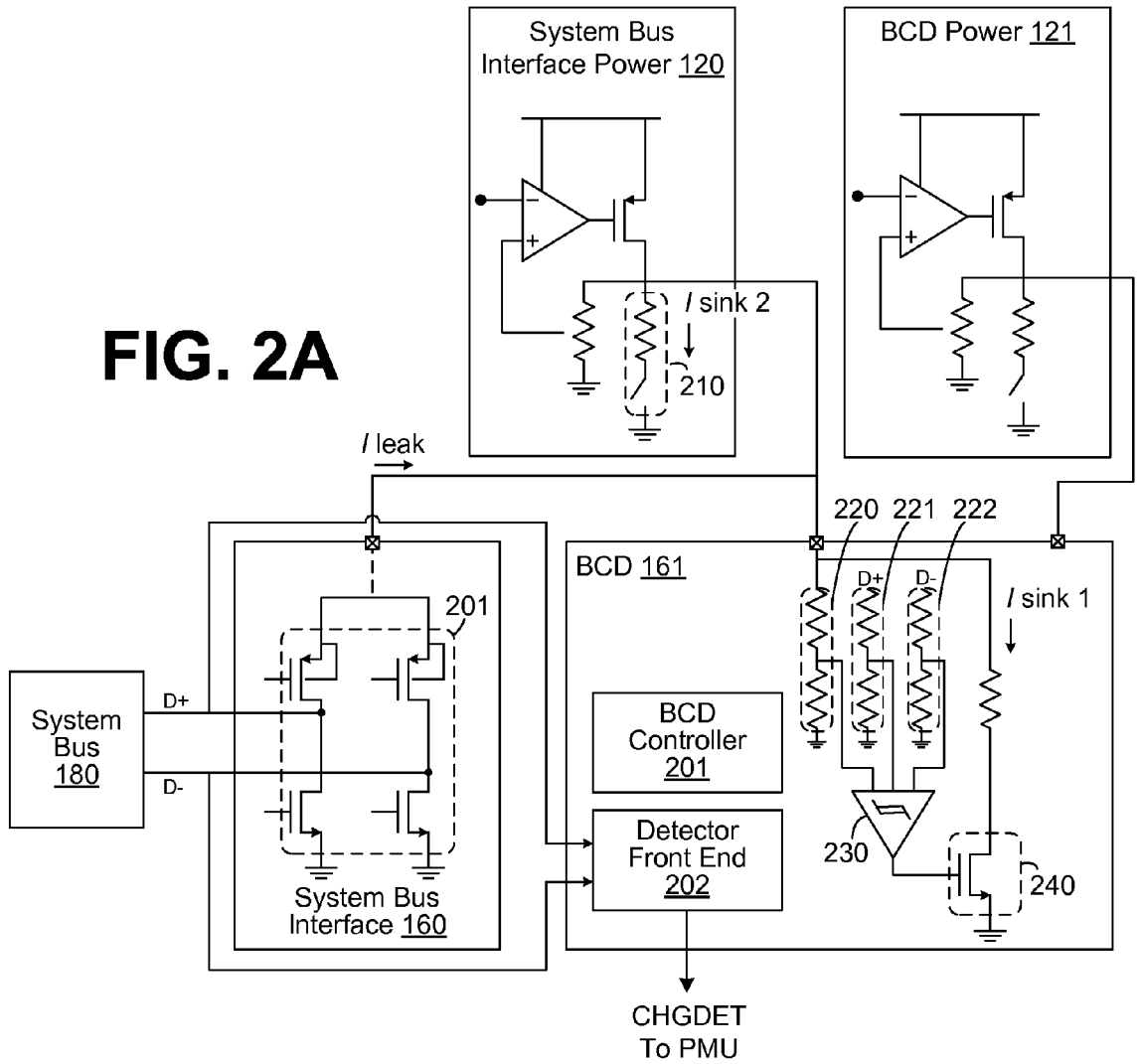
FIG. 2A illustrates a system bus interface and battery charger detect circuit in the system of FIG. 1 according to one example embodiment.

Turning to FIGS. 2A, 2B, and 3-5, aspects of the operation of the system 10 are described in further detail. FIG. 2A illustrates the system bus interface 160 and battery charger detect circuit 161 in the system 10 of FIG. 1 according to one example embodiment. FIG. 2A also illustrates the system bus interface power rail 120 and the BCD power rail 121. Generally, FIG. 2A illustrates representative diagrams of the system bus interface 160 and battery charger detect circuit 161 in the system 10 of FIG. 1. That is, the illustrations of system bus interface 160 and the battery charger detect circuit 161 in FIG. 2A are not intended to be limiting or exclusive. Rather, the illustrations are intended to illustrate the principles of operation of the embodiments described herein.

In one embodiment, the system bus interface power rail 120 and the BCD power rail 121 are separate in the system 10. In this case, the system bus interface power rail 120 provides power to the system bus interface 160, and the BCD power rail 121 provides power to the BCD 161 (and perhaps other associated communications logic or circuitry). In another embodiment, only one power rail (e.g., one of the system bus interface power rail 120 and the BCD power rail 121) is relied upon in the system 10 to provide power to both the system bus interface 160 and the BCD 161. In either embodiment, according to aspects of the embodiments described herein, the power rail or rails coupled to the system bus interface 160 and/or the BCD 161 include reverse current sink circuits to sink reverse current as described in further detail below.

The system bus interface 160 includes a physical (i.e., PHY layer) interface to the system bus 180. As illustrated in FIG. 2A, the system bus interface 160 includes a physical interface 201 with drive transistors having outputs coupled to drive certain voltage logic levels on the D+ and D− differential data conductors of the system bus 180. According to aspects of the embodiments described herein, a problem may exist when, if an unexpectedly high voltage (e.g., 5V) is applied to either one of the D+ or D− differential data conductors and one or more of the drive transistors are turned on, a reverse current/leak may flow from the D+ or D− differential data conductors, into the system bus interface 160, and possibly into the system bus interface power rail 120 and/or the BCD power rail 121. This reverse current may damage one or more of the system bus interface power rail 120, the system battery 182, or other elements in the system 10. This reverse current/leak may occur in part because the system bus interface power rail 120 and/or the BCD power rail 121 may be set to an output voltage of about 3.3V, which may be suitable for driving differential logic signals to the system bus 180. However, if a voltage of 5V, for example, is applied to either one of the D+ or D− differential data conductors, a reverse current may begin to flow into the system bus interface 160. Further, in some embodiments, the system bus interface 160 may include static discharge or other diodes, for example, coupled to pads of the host SOC 130. These diodes may become forward biased if an unexpectedly high voltage is present on the D+ or D− differential data conductors, leading to reverse current into the system bus interface 160. The possibility of this reverse current in conventional systems was one factor in the lack of detection and identification of charger types by power management units.

According to aspects of the embodiments described herein, the BCD 161 includes a reverse current sink transistor or switch 240, reverse current voltage dividers 220-222, and a reverse current comparator 230. Together, the reverse current sink transistor 240, voltage dividers 220-222, and comparator 230 comprise elements of a reverse current sink circuit that detects whether a condition for reverse current is present on the system bus 180. As illustrated in FIG. 2A, the BCD 161 also includes a BCD controller 201 and a detector front end 202. Generally, the BCD controller 201 may control operations of the BCD 161 and/or the detector front end 202, and the detector front end 202 may detect a type of battery charger or charging port coupled to the system bus 180.

In operation, the reverse current comparator 230 compares the voltages at the reverse current voltage dividers 220-222. As illustrated in FIG. 2A, the reverse current voltage dividers 220-222 are coupled respectively to the output voltage of the system bus interface power rail 120, the D+ data conductor, and the D− data conductor. Thus, using the reverse current voltage dividers 220-222, the reverse current comparator 230 may identify whether either the D+ or D− data conductors maintains a voltage that is higher than the output voltage of the system bus interface power rail 120. If the reverse current comparator 230 identifies that either one of the D+ or D− data conductors maintains a voltage that is higher than the output voltage of the system bus interface power rail 120, then the reverse current comparator 230 provides a control signal to turn the reverse current sink transistor 240 on. In this case, a reverse current/sink 1 may be sunk via the reverse current sink transistor 240, avoiding damage to the system 10.

In addition to the reverse current sink circuitry in the BCD 161, the system bus interface power rail 120 includes current sink circuitry 210, as illustrated in FIG. 2A. The current sink circuitry 210 may be enabled to sink a reverse current/sink 2 if a reverse current flows into the system bus interface power rail 120 before the system 10 detects whether a charger is coupled to the system bus 180 and/or powers on the system bus interface power rail 120. Here, it is noted that the reverse current sink circuitry in the BCD 161 is generally relied upon after the system bus interface power rail 120 is powered on, and the current sink circuitry 210 is relied upon before the system bus interface power rail 120 is powered on.

By relying upon one or more of the reverse current sink circuits to address or mitigate any reverse current, the detector front end circuit 202 may be able to identify a type of charger or charging port coupled to the system bus 180. In certain aspects, the front end circuit 202 may identify or detect one or more of a charging downstream port (CDP), a dedicated charging port (DCP), an accessory charging adapter port (ACA), a personal system 2 (PS/2) port, or a standard downstream port (SDP) being coupled to the system bus 180. The front end circuit 202 may further identify or detect a type of charging port coupled to the system bus 180 by one or more of data contact detection, primary detection to distinguish between CDP, DCP, and ACA ports, secondary detection to distinguish between the CDP and DCP ports, and ACA device detection. Additionally, the front end circuit 202 may be able to identify whether other proprietary types of chargers are coupled to the system bus 180. In various embodiments, the front end circuit 202 may be able to identify or distinguish between 5, 7, 9, or more different types of battery chargers and/or charging ports.

It is noted that, in cables that couple PS/2-style connectors with mini- or micro-USB connectors, for example, one or both of the D+ and D− conductors may be pulled high. In this case, if the detector front end circuit 202 checks only for a voltage of greater than a certain reference voltage V_REF on the D− conductor, then the detector front end circuit 202 may determine that the system bus 180 is attached to a DCP or CDP port. In turn, the PMU 100 may proceed to draw current according to that which is supported by a DCP or CDP port. Such a current draw could potentially damage the PS/2 port.

According to aspects of the embodiments described herein, a PS/2-style charging port may be detected safely without damage to the PS/2 computing device. Particularly, the detector front end circuit 202 may determine whether the system bus 180 is coupled to a DCP or CDP port only if a voltage on the D− conductor is less than a certain voltage VLGC, and the system 10 can avoid causing damage to a PS/2 port. It is noted that some proprietary chargers also pull the D+ and D− conductors high. If a PD is attached to one of these chargers, and the detector front end circuit 202 determines that the system bus 180 is not attached to a charger because the voltage on the D− conductor is greater than VLGC, then the detector front end circuit 202 determines that the system bus 180 is coupled to an SDP port, and the PMU 100 may proceed to draw the appropriate current for an SDP port. In one aspect, the choice of whether or not to compare D− to VLGC depends on whether the system bus is more likely to be coupled to a PS/2 port or to a proprietary charger.

As further described below with reference to FIGS. 3-5, after the detector front end 202 performs the identification or detection of the type of battery charger or charging port coupled to the system bus 180, the front end detector 202 may communicate an indicator CHGDET signal to the PMU 100, where the CHGDET signal indicates the type of charger or charging port coupled to the system bus 180. In one embodiment, the front end detector 202 may communicate the CHGDET signal to the PMU 100 over a single pin interface between the host SOC 130 and the PMU 100. Here, it is noted that the PMU 100 may rely upon a single pin to identify the type of charger or charging port coupled to the system bus 180 for backwards compatibility with conventional BCD circuits that are capable of identifying between only two different types of chargers.

Figure 2B:
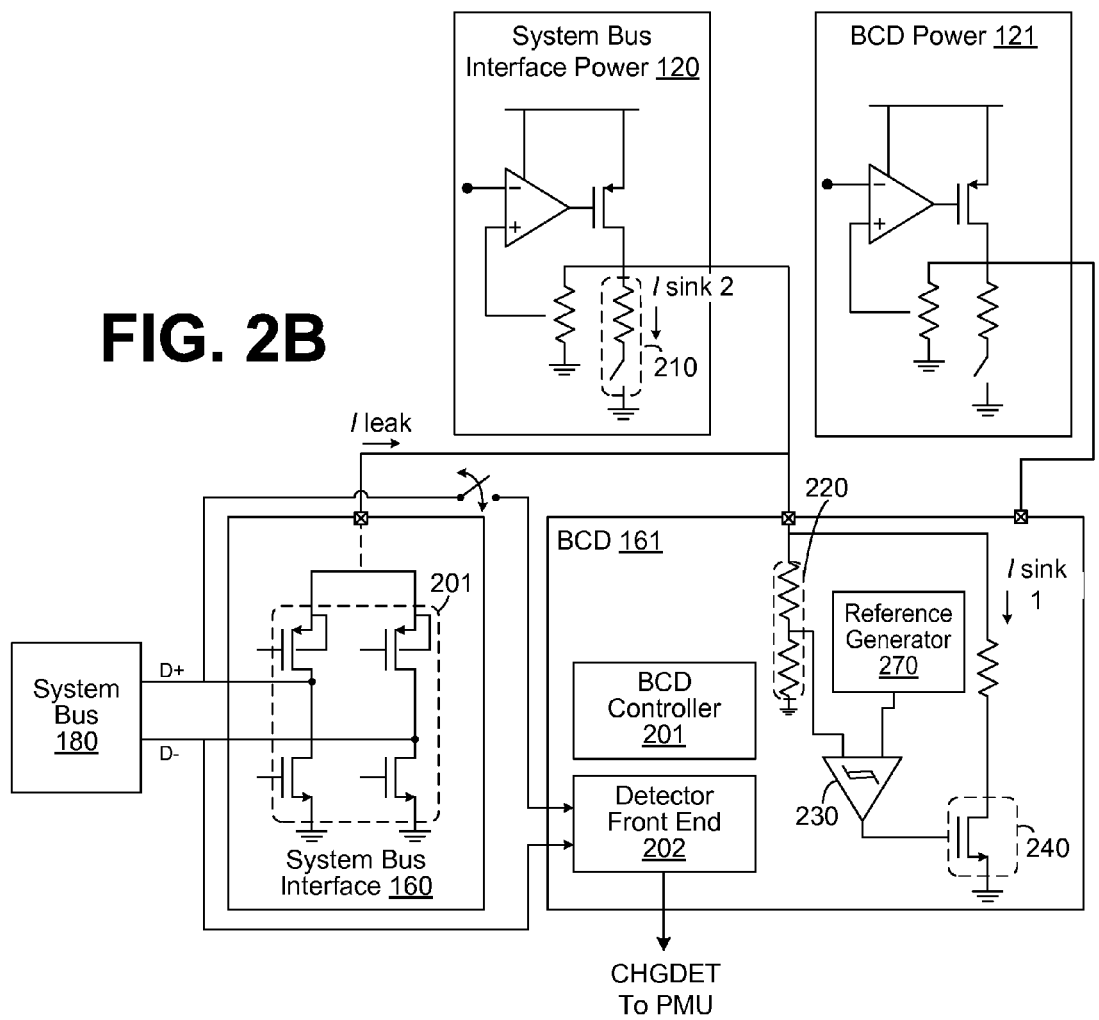
FIG. 2B illustrates a system bus interface and battery charger detect circuit in the system of FIG. 1 according to another example embodiment.

FIG. 2B illustrates the system bus interface 180 and battery charger detect circuit 161 in the system of FIG. 1 according to another example embodiment. The embodiment illustrated in FIG. 2B is similar to the embodiment illustrated in FIG. 2A, with certain differences in the reverse current sink circuitry in the BCD circuit 161. In FIG. 2B, the BCD circuit 161 includes the reverse current voltage divider 220, the reverse current comparator 230, the reverse current sink transistor or switch 240, and a reference generator 270.

In operation, using the reverse current voltage divider 220, the reverse current comparator 230 may identify whether, due to a reverse bias voltage and/or reverse current/leak, the output voltage of the system bus interface power rail 120 is higher than a reference voltage output by the reference generator 270. If the reverse current comparator 230 identifies a reverse bias or current condition, then the reverse current sink transistor or switch 240 sinks the reverse current/sink 1, avoiding damage to the system 10.

Figure 3:
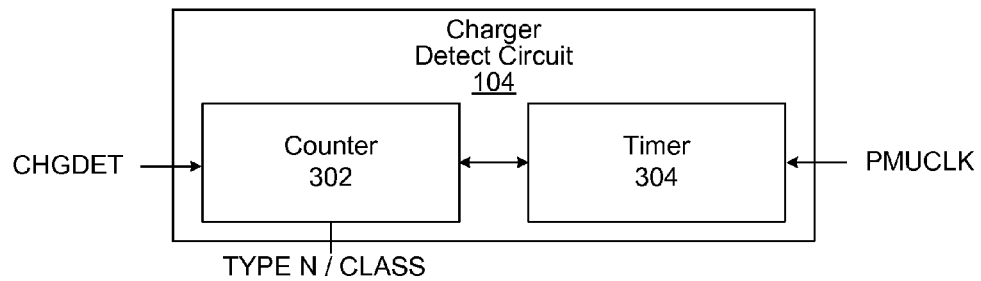
FIG. 3 illustrates charger detect circuit in the system of FIG. 1 according to an example embodiment.

Turning to further details on the communication of the CHGDET signal to the PMU 100 via the single pin interface between the host SOC 130 and the PMU 100, FIG. 3 illustrates the charger detect circuit 104 in the system of FIG. 1 according to an example embodiment. It is noted that some conventional systems have relied upon the detection of only two types or groups of battery chargers, in part, to reduce the number of pins required to communicate the type of charger detected. In this case, different types of chargers were represented in one of the two groups, although the different types of chargers were capable of providing different charging currents. For each group, it was necessary to default to or rely upon a lowest charging current possible among the chargers in the group, because limited information was available.

According to aspects of the system 10 described below, the BCD 161 may distinguish between several different types of battery chargers and/or charging ports coupled to the system bus 180, and communicate an indicator of the identified type of charger to the charger detect circuit 104 using only a single pin or conductor and without grouping different types of chargers. In this way, more than two types or groups of battery chargers can be identified in the system 10 while maintaining a low pin count. Also, backwards compatibility is maintained with conventional BCD circuits that only detect two types or groups of chargers. The ability to identify and distinguish between several different types of battery chargers and charging ports permits faster battery charging overall, because a more granular selection of battery charging current may be achieved.

The charger detect circuit 104 includes a counter 302 and a timer 304. In one embodiment, the counter 302 receives the CHGDET signal from the BCD 161 and one or more timing signals from the timer 304 for timing out operations of the counter 302. The timer 304 receives the PMUCLK signal and generates the one or more timing signals for timing out operations of the counter 302.

As further described below with reference to FIGS. 4 and 5, the CHGDET signal from the BCD 161 may include a number of charger type pulse transitions based on the type of the battery charger or charging port coupled to the system bus 180. The CHGDET signal may also include a charger class type indicator for backwards compatibility, as described below. With reference to the CHGDET signal, the charger detect circuit 104 may identify the type of battery charger or charging port coupled to the system bus 180 by accumulating the number of charger type pulse transitions on the CHGDET signal. The number of charger type pulse transitions may be compared against a lookup table to identify the type of battery charger or charging port. The charger detect circuit 104 may also identify a class of the battery charger or charging port coupled to the system bus 180 based on the CHGDET charger class type indicator.

Figure 4:
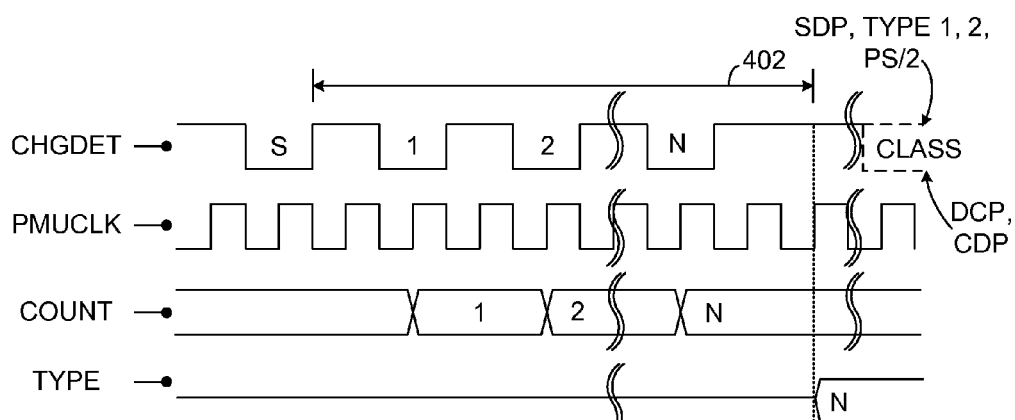
FIG. 4 illustrates timing diagrams for signals relied upon by the charger detect circuit in the system of FIG. 1 according to one example embodiment.

FIG. 4 illustrates timing diagrams for signals relied upon by the charger detect circuit 104 in the system of FIG. 1 according to one example embodiment. As illustrated, the CHGDET signal includes a start pulse S, and a number of pulse transitions 1 to N. With reference to the PMUCLK for timing, the counter 302 of the charger detect circuit 104 counts each of the pulse transitions 1 to N that occur after the start S pulse. In FIG. 4, an illustration of the ongoing count which is maintained by the counter 302 is provided by the COUNT signal.

In one embodiment, when the charger detect circuit 104 accumulates the charger type pulse transitions 1 to N and no additional charger type pulse transition is accumulated within a predetermined time period 402, the accumulation ends. In various embodiments, the predetermined time period 402 may be measured from the rising edge of the start pulse S, as illustrated in FIG. 4, from an edge of the last charger type pulse transition 1 to N received, or from any other suitable signal edge. At the end of the predetermined time period 402, the accumulated value of COUNT is sampled and output by the counter 301.

According to various embodiments, the predetermined time period 402 may be configured and set to any time period suitable for the application. In general, the predetermined time period 402 is relied upon to ensure that the measurement or count of the start pulse S and the charger type pulse transitions 1 to N is completed within a certain time period. In FIG. 4, an illustration of the final count of the number of pulse transitions is provided by the TYPE signal. The number of charger type pulse transitions may be compared against a lookup table to identify the type of battery charger or charging port. The lookup table may identify, for example, that a count of 7 is associated with a PS/2 port, that a count of 6 is associated with an ACA port, that a count of 5 is associated with a first proprietary type of charger (i.e., a "Type 1 charger"), that a count of 4 is associated with a second proprietary type of charger (i.e., a "Type 2 charger"), that a count of 3 is associated with a CDP port, that a count of 2 is associated with a DCP port, and that a count of 1 is associated with an SDP port. However, other arrangements of lookup tables are within the scope and spirit of the embodiments described herein.

Figure 5:
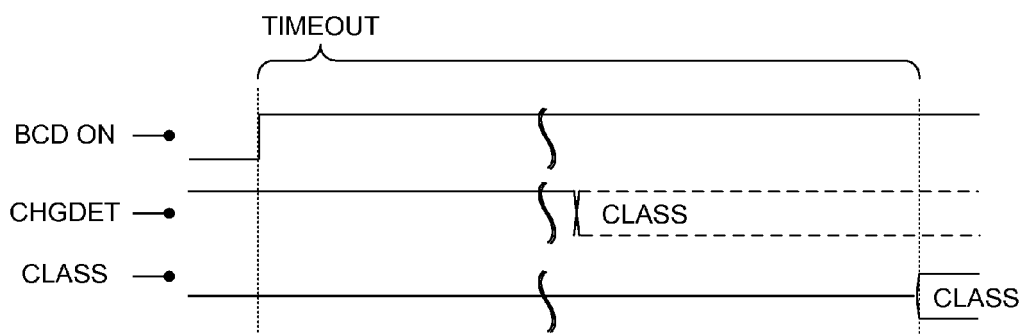
FIG. 5 illustrates timing diagrams for signals relied upon by the charger detect circuit in the system of FIG. 1 according to another example embodiment.

FIG. 5 illustrates timing diagrams for signals relied upon by the charger detect circuit 104 in the system of FIG. 1 according to another example embodiment. With reference between FIGS. 4 and 5, it is noted that the charger detect circuit 104 may also identify a class of the battery charger or charging port coupled to the system bus 180 based on a charger class type indicator, illustrated as the CLASS portion of the CHGDET signal in FIGS. 4 and 5. As compared to the type of charger or charging port, as described herein, the class of the charger or charging port may be representative of relatively less information, and is relied upon for backwards compatibility with BCD circuits that cannot distinguish between more than two different types or classes of chargers. For example, some conventional battery charger detection circuits may only be able to distinguish between two types, classes, or groups of chargers or charging ports. In this case, for example, a first class or group may be representative of SDP, Type 1, Type 2, or PS/2 chargers or charging ports, and a second class or group may be representative of DCP or CDP chargers or charging ports. To distinguish among the two classes or groups, only two logic levels are needed.

According to aspects of the embodiments described herein, at some time after the start S and pulse transitions 1 to N of the CHGDET signal, the CHGDET signal settles to either a logic low or high CLASS value, as illustrated in FIG. 4. It is noted that, in certain embodiments, the CHGDET signal may settle to the CLASS signal even without any start S and pulse transitions 1 to N, as illustrated in FIG. 5. This may be the case if a conventional BCD circuit is coupled to the PMU 100. Thus, the charger detect circuit 104 is further able to identify the class or group of the battery charger or charging port coupled to the system bus 180 based on the charger class type indicator CLASS. In one embodiment, the charger detect circuit 104 waits the predetermined time period TIMEOUT, which is measured from after powering on the power rail for the BCD 161 by the timer 304, to sample the class type indicator, as illustrated in FIG. 5.

Figure 6:
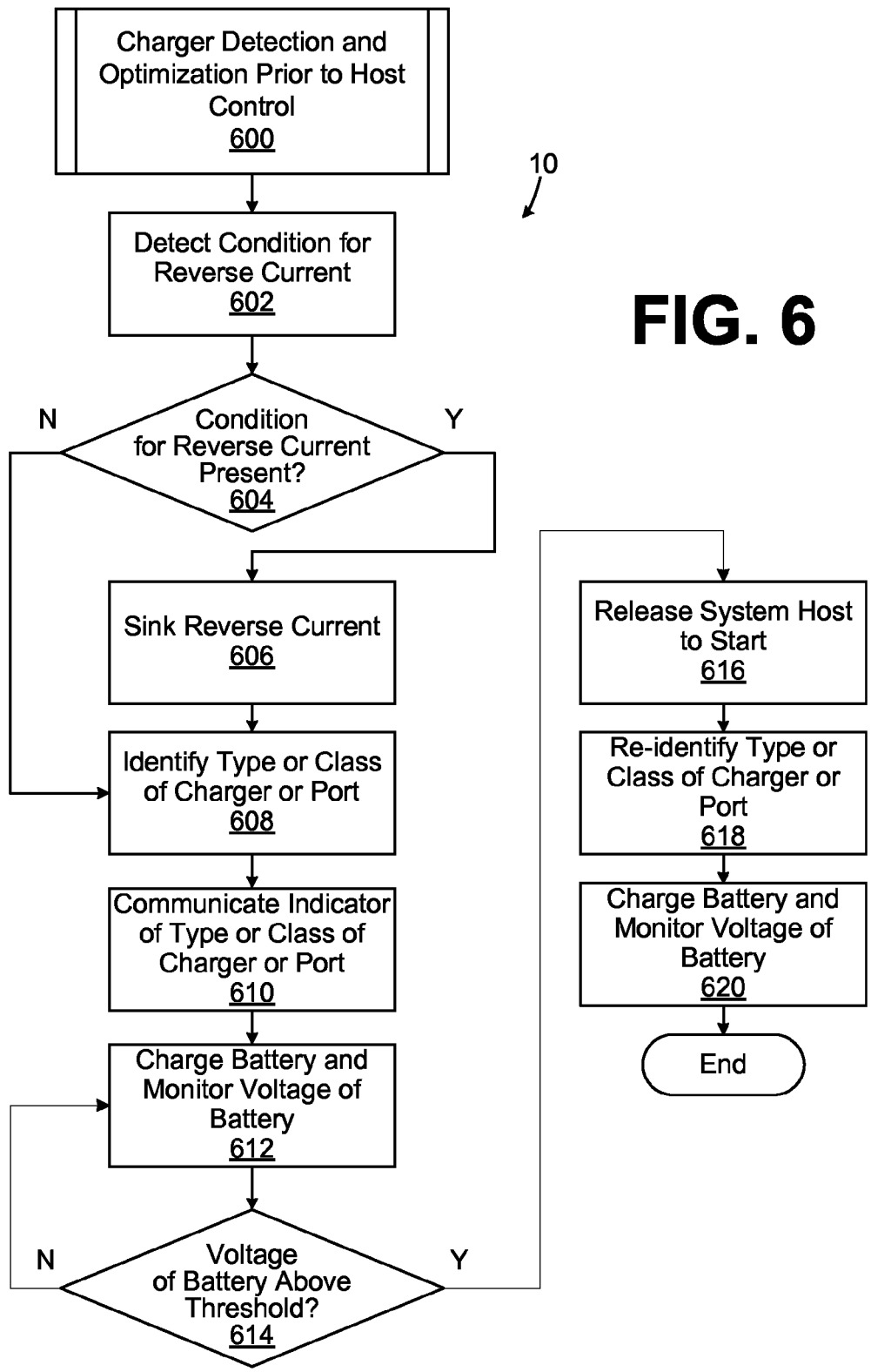
FIG. 6 illustrates a process flow diagram for a method of charger detection and optimization prior to host control performed by the system of FIG. 1 according to an example embodiment.

Turning to FIG. 6, process flow diagrams illustrating example processes performed by a system for charger detection and optimization prior to host control are provided. While the process flow diagrams are described in connection with the system 10 of FIG. 1, it is noted that other systems may perform the illustrated processes. That is, in various embodiments, systems similar to the system 10 may perform the processes illustrated in FIG. 6.

In certain aspects, the flowchart of FIG. 6 may be considered to depict example steps performed by the system 10 according to one or more embodiments. Although the process diagram of FIG. 6 illustrates an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

FIG. 6 illustrates a process flow diagram for a method 600 of charger detection and optimization prior to host control performed by the system 10 of FIG. 1 according to an example embodiment. Starting at reference numeral 602, the process 600 includes detecting whether a battery charger or charging port is coupled to the system bus 180 and also detecting whether a condition for reverse current is present on a system bus. For example, the BCD 161 may detect whether a battery charger or charging port is coupled to the system bus 180. Further, one of the reverse current sink circuits of the BCD 161, described in FIGS. 2A and 2B, may detect whether a condition for reverse current is present on the system bus 180.

At reference numeral 604, the process 600 includes determining whether the condition for reverse current is present. When the condition for reverse current is present, the process 600 proceeds to reference numeral 606. At reference numeral 606, the process 600 includes sinking the reverse current. The sinking of reverse current may be achieved by any of the reverse current sink circuits of the BCD 161, as described in FIGS. 2A and 2B. On the other hand, when the condition for reverse current is not present, the process 600 proceeds to reference numeral 608. At reference numeral 608, the process 600 includes identifying or determining a type of charger or charging port coupled to the system bus. As described herein, the identifying may be performed by the front end detector 202 of the BCD 161, as described above with reference to FIGS. 2A and 2B.

Continuing on, at reference numeral 610, the process 600 includes communicating an indicator of the type of charger or charging port coupled to the system bus. In certain embodiments, the communicating may be performed over a single pin interface. The communicating may be achieved between the BCD 161 and the charger detect circuit 104, by referencing a number of charger type pulse transitions and/or a charger class type indicator, as described above with reference to FIGS. 3-5.

After reference numeral 610, the process 600 proceeds to reference numeral 612, which includes charging a battery based on the type or class of charger or charging port, and monitoring a voltage of the battery. The charging may be performed by the battery charger circuit 105, and the monitoring may be performed by the PMU controller 101 using the ADC 111, as illustrated in FIG. 1. At reference numeral 612, the process 600 may include accessing a table in the OTP map 106 or another memory, for example, to identify a charging current for a battery based on the number of charger type pulse transitions communicated at reference numeral 610.

Here, it is noted that the charging may include charging the system battery 182 based on the type or class of charger or charging port. Because a more granular indication of charger or charging port type was communicated at reference numeral 610, the charging at reference numeral 610 may proceed according to a maximum charging current possible. In other words, it is not necessary to default to the lowest charging current among chargers in a group, and the system battery 182 may be charged at a faster rate.

At reference numeral 614, the process 600 includes determining whether the voltage of the battery is above or greater than a predetermined threshold. For example, if the PMU controller 101 determines at reference numeral 614 that the voltage VBat of the system battery 182 is above a predetermined threshold, then the process 600 may proceed to reference numeral 616. Otherwise, if the PMU controller 101 determines at reference numeral 614 that the voltage VBat of the system battery 182 is not above the predetermined threshold, then the process 600 may proceed back to reference numeral 612 for further charging and monitoring.

At reference numeral 616, the process 600 includes releasing a system host processor to start. For example, the PMU 100 may release the application processor 140 of the host SOC 130 for start. At reference numeral 618, process 600 includes re-identifying the type or class of charger or charging port coupled to the system bus. That is, the host processor 140 may, for example, communicate over the system bus 180, to determine or re-identify the type or class of charger or charging port coupled to the system bus 180. At reference numeral 620, based on the re-identification at reference numeral 618, the process 600 further includes charging the battery based and monitoring the voltage of the battery based on host processor control. For example, at reference numeral 620, charging and monitoring of the system battery 182 is transitioned to oversight by the application processor 140, which is able to control the PMU 100 to direct battery charging via communications over the serial interface 128.

In the context of the example provided above, it should be appreciated that, according to aspects of the embodiments described herein, the application processor 140 may be permitted to start or boot earlier than would be possible otherwise. Specifically, to prevent the system 10 from crashing due to the voltage level VBat drooping below a minimum operating threshold when the application processor 140 is started, one conventional approach has been to wait until the voltage level VBat reaches or exceeds a certain high threshold. Reaching the high threshold may take less time if the system battery 182 can be charged at a higher rate. However, this higher rate of charging can only be achieved if it is optimized based on knowledge of the type of battery charger or charging port coupled to the system bus 180.

With regard to aspects of the structure or architecture of the system 10, in various embodiments, each of the PMU controller 101, the power processor 132, and or other processors or processing circuits of the system 10 may comprise general purpose arithmetic processors, state machines, or Application Specific Integrated Circuits ("ASICs"), for example. Each such processor or processing circuit may be configured to execute one or more computer-readable software instruction modules. In certain embodiments, each processor or processing circuit may comprise a state machine or ASIC, and the processes described in FIGS. 2A, 2B, and 3 may be implemented or executed by the state machine or ASIC according to the computer-readable instructions.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

At least the following is claimed:

1. A method, comprising:
   detecting, with a plurality of voltage dividers, whether a condition for reverse current is present on a system bus;
   when the condition for reverse current is present, sinking the reverse current; and
   after the sinking, identifying, with a battery charger detector and while a host processor is halted, a type of charger or charging port coupled to the system bus.

2. The method according to claim 1, further comprising:
   charging, with a battery charger circuit, a battery according to a maximum possible charging current based on the type of charger or charging port; and
   monitoring a voltage of the battery.

3. The method according to claim 2, further comprising when the voltage of the battery is above a predetermined threshold, releasing the host processor to start.

4. The method according to claim 1, further comprising communicating an indicator of the type of charger or charging port coupled to the system bus over a single pin interface.

5. The method according to claim 4, wherein:
   the indicator of the type of charger or charging port coupled to the system bus comprises a charger class type indicator based on the type of the charger or charging port; and
   the method further comprises identifying a class of the charger or charging port coupled to the system bus based on the charger class type indicator.

6. The method according to claim 4, wherein:
   the indicator of the type of charger or charging port coupled to the system bus comprises a number of charger type pulse transitions based on the type of the charger or charging port; and
   the method further comprises identifying the type of charger or charging port by accumulating the number of charger type pulse transitions.

7. The method according to claim 6, further comprising, when accumulating the charger type pulse transitions and no additional charger type pulse transition is accumulated within a predetermined time period, comparing the number of pulse transitions to a lookup table to identify the type of charger or charging port.

8. The method according to claim 6, further comprising accessing a table to identify a charging current for a battery based on the number of charger type pulse transitions.

9. The method according to claim 1, wherein the type of charger or charging port comprises one of a charging downstream port (CDP), a dedicated charging port (DCP), an accessory charging adapter port (ACA), a personal system 2 (PS/2) port, or a standard downstream port (SDP), or another proprietary type of battery charger or charging port.

10. A system, comprising:
    a reverse current sink circuit that:
    detects, with a plurality of voltage dividers while a host processor of the system is halted whether a condition for reverse current is present on a system bus;
    sinks the reverse current when the condition for reverse current is present; and
    a battery charger detector that identifies a type of charger or charging port coupled to the system bus.

11. The system according to claim 10, further comprising:
a battery charger circuit that charges a battery based on the type of charger or charging port; and
a power management unit (PMU) controller that monitors a voltage of the battery.

12. The system according to claim 11, wherein the PMU further releases the host processor to start when the voltage of the battery is above a predetermined threshold.

13. The system according to claim 10, wherein the battery charger detector further communicates an indicator of the type of charger or charging port coupled to the system bus over a single pin interface.

14. The system according to claim 13, wherein the indicator of the type of charger or charging port coupled to the system bus comprises a charger class type indicator based on the type of the charger or charging port.

15. The system according to claim 13, wherein:
the indicator of the type of charger or charging port coupled to the system bus comprises a number of charger type pulse transitions based on the type of the charger or charging port; and
the system further comprises a charger detect circuit that identifies the type of charger or charging port by accumulating the number of charger type pulse transitions.

16. A method, comprising:
detecting, with a plurality of voltage dividers, whether a condition for reverse current is present on a system bus;
when the condition for reverse current is present, sinking the reverse current;
after the sinking, identifying, with a battery charger detector and while a host processor is halted, a type of charger or charging port coupled to the system bus; and
charging a battery based on the type of charger or charging port.

17. The method according to claim 16, further comprising:
monitoring a voltage of the battery; and
when the voltage of the battery is above a predetermined threshold, releasing the host processor to start.

18. The method according to claim 16, further comprising communicating an indicator of the type of charger or charging port coupled to the system bus over a single pin interface.

19. The method according to claim 18, wherein:
the indicator of the type of charger or charging port coupled to the system bus comprises a charger class type indicator based on the type of the charger or charging port; and
the method further comprises identifying a class of the charger or charging port coupled to the system bus based on the charger class type indicator.

20. The method according to claim 18, wherein:
the indicator of the type of charger or charging port coupled to the system bus comprises a number of charger type pulse transitions based on the type of the charger or charging port; and
the method further comprises identifying the type of charger or charging port by accumulating the number of charger type pulse transitions.

* * * * *